(12) United States Patent
Arnet

(10) Patent No.: US 7,560,895 B2
(45) Date of Patent: Jul. 14, 2009

(54) INDIRECT ROTOR RESISTANCE ESTIMATION SYSTEM AND METHOD

(75) Inventor: Beat J. Arnet, Winchester, MA (US)

(73) Assignee: Azure Dynamics, Inc., Woburn, MA (US)

( * ) Notice: Subject to any disclaimer, the term of this patent is extended or adjusted under 35 U.S.C. 154(b) by 326 days.

(21) Appl. No.: 11/724,904

(22) Filed: Mar. 16, 2007

(65) Prior Publication Data

US 2008/0228416 A1    Sep. 18, 2008

(51) Int. Cl.
H02P 1/16    (2006.01)
(52) U.S. Cl. .................. 318/778; 318/727; 318/805; 318/802; 318/812; 318/723
(58) Field of Classification Search .......... 318/778, 318/812, 723, 805, 802, 727
See application file for complete search history.

(56) References Cited

U.S. PATENT DOCUMENTS

| | | | |
|---|---|---|---|
| 4,442,393 A | | 4/1984 | Abbondanti |
| 4,670,698 A | | 6/1987 | Fulton et al. |
| 4,914,386 A | | 4/1990 | Zocholl |
| 5,278,485 A | | 1/1994 | Kim |
| 5,479,081 A | * | 12/1995 | Seibel et al. ............. 318/805 |
| 5,502,360 A | * | 3/1996 | Kerkman et al. ......... 318/805 |
| 5,537,308 A | * | 7/1996 | Gritter ..................... 363/95 |
| 5,598,081 A | * | 1/1997 | Okamura et al. ......... 318/801 |
| 5,619,114 A | * | 4/1997 | Blasko .................... 318/812 |
| 5,861,728 A | | 1/1999 | Tazawa et al. |
| 5,998,958 A | | 12/1999 | Lee |
| 6,014,006 A | | 1/2000 | Stuntz et al. |
| 6,042,265 A | | 3/2000 | Kliman et al. |
| 6,281,659 B1 | | 8/2001 | Giuseppe |
| 6,316,904 B1 | | 11/2001 | Semenov et al. |
| 6,359,416 B1 | | 3/2002 | Rao et al. |
| 6,433,506 B1 | | 8/2002 | Pavlov et al. |
| 6,636,012 B2 | | 10/2003 | Royak et al. |
| 6,661,194 B2 | | 12/2003 | Zaremba et al. |
| 6,774,664 B2 | | 8/2004 | Godbersen |
| 6,862,538 B2 | | 3/2005 | El-Ibiary |
| 6,870,348 B2 | | 3/2005 | Mijalkovic et al. |
| 6,879,130 B2 | | 4/2005 | Iwashita et al. |
| 2002/0158658 A1 | | 10/2002 | Godbersen |
| 2002/0195986 A1 | | 12/2002 | Weigel et al. |
| 2003/0163296 A1 | | 8/2003 | Richards |
| 2005/0062450 A1 | | 3/2005 | Pace |

OTHER PUBLICATIONS

Dimitrios Karagiannis, Alessandro Astolfi, *Rotor Resistance Estimation for Current-Fed Induction Motors*, Department of Electrical and Electronic Engineering Imperial College, London England 2005.

(Continued)

*Primary Examiner*—Rita Leykin
(74) *Attorney, Agent, or Firm*—Iandiorio Teska & Coleman

(57) ABSTRACT

Indirect rotor resistance estimation for an AC induction motor is achieved by successively stepping the quadrature command to zero and the direct current command to a predetermined value causing the quadrature stator voltage to decay as a representation of rotor current decay; defining, in response to the decaying stator voltage reaching two spaced thresholds, a voltage/time difference, and retrieving from a storage device the rotor resistance associated with the voltage/time difference.

29 Claims, 10 Drawing Sheets

OTHER PUBLICATIONS

S. Wade, M. W. Dunnigan, B. W. Williams, *Improving the accuracy of the Rotor Resistance Estimate for Vector-Controlled Induction Machines*, IEEE Proc.-Electr. Power Appl., vol. 144, No. 5, Sep. 1997, pp. 285-294.

Ohm et al., Rotor Time Constant Adaptation Method for Induction Motors Using DC Link Power Measurement, 1989, IEEE, 89CH2792-0/89/0000, pp. 588-593.

Ambrozic et al., A Step Voltage Method for Determination of an Induction Motor Rotor Time Constant in a Cold State, 1993, IEEE, 0-7803-1227-9/93, pp. 85-89.

Kwon et al., Measurement of Rotor Time Constant Taking Into Account Magnetizing Flux in the Induction Motor, 1994, IEEE, 0-7803-1993-1/94, pp. 88-92.

L. Umanand et al., Adaptation of the Rotor Time Constant for Variations in the Rotor Resistance of an Induction Motor, 1994, IEEE 0-7803-1859-5/94, pp. 738-743.

Cerruto et al., Rotor Time Constant Determination of Induction Motor Drives via Steady-State Torque Analysis, 1994, IEEE, 0-7803-1772-6/94, pp. 1318-1321.

Toliyat et al., Rotor Time Constant Updating Scheme for a Rotor Flux Oriented Induction Motor Drive, 1995, IEEE, 0-7803-2730-6/95, pp. 1302,-1306.

Palani, et al. A New Rotor Time Constant Adaptation Method for a VSI FED Indirect Field Oriented Induction Motor Drive,1996, IEEE, 0-7803-2795-0, pp. 222-228.

Ba-razzouk et al., Real Time Implementation of a Rotor Time-Constant Online Estimation Scheme,1999, IEEE, 0-7803-5735-3/99, pp. 927-932.

Kral, et al., Rotor Temperature Estimation of Squirrel Cage Induction Motors by Means of a Combined Scheme of Parameter Estimation and a Thermal Equivalent Model, 2003, IEEE, 0-7803-7817-2/03, pp. 931-937.

Wang et al., Tracking the Rotor Time Constant of an Induction Motor Traction Drive for HEV's, 2004, IEEE, 0-7803-8538, pp. 83-88.

Wang et al., An Automated Rotor Time Constant Measurement System for Indirect Field-Oriented Drives, 1988, IEEE, 0093-9994/88/0100/0051, pp. 151-159.

* cited by examiner

⊙ = Optimal point of operation for given stator current

US 7,560,895 B2

INDIRECT ROTOR RESISTANCE ESTIMATION SYSTEM AND METHOD

FIELD OF THE INVENTION

An improved indirect rotor resistance estimator system and method for an AC induction motor.

BACKGROUND OF THE INVENTION

Improvements in power-electronics and the advent of digital signal processors (DSPs) has allowed for the use of inexpensive and rugged induction motors in applications which were so far reserved for brushed DC motors (such as traction drives and variable speed industrial drives). By taking advantage of the new control technologies and new hardware available, AC induction motors can achieve the same dynamic performance as a DC motor, while exhibiting higher power density, lower cost and zero maintenance.

The two most prevalent advanced control methods for induction motors are "field oriented control" (FOC) and "direct torque control" (DTC)". FOC was first proposed over thirty years ago (in 1971 by F. Blaschke), while the more "modern" DTC emerged a decade later. The advantage of DTC is its simplicity, requiring no current regulator and being very robust to parameter variations. DTC, however, also presents some drawbacks compared to FOC, such as high current ripple, difficulty to control torque and flux at low speeds, high acoustic noise at low speed and lack of direct current control. These issues are the reason why FOC is still widely used for electric traction, where low speed performance and accurate current control are very important features.

In FOC, the three-phase current wave-forms and voltage wave-forms are transformed into a two-axis dq-frame (synchronous frame) which is rotating at the frequency of the electrical waveforms. By this coordinate transformation, AC waveforms result in DC vectors (also called space vectors). The advantage of this approach is that it is much easier to control DC quantities than AC quantities. The implementation of a digital current regulator is therefore relatively straightforward and can be very robust and dynamic.

If the synchronous frame is aligned with the rotor flux ($\Psi_r$), then the current component aligned with the flux (direct current, Id) can be used to control the flux of the machine while the quadrature current (Iq) controls the magnitude of the motor torque. This decoupling of torque and flux allows for dynamic variable speed performance that rivals, if not out-performs, a DC motor.

In order to align the d-q frame with the (rotating) rotor flux, the instantaneous position of the rotor flux ($\theta_r$) with respect to the motor winding phases U, V, W needs to be known, and therein lays the difficulty of the FOC method. Since it is impractical to measure the position of the rotor flux directly, it has to be estimated indirectly, hence the method is often referred to as indirect field oriented control.

The technique for estimating the position ($\theta_r$) of the rotor flux is based on integrating the electrical frequency ($\omega s$) which can be computed from the rotational frequency of the rotor ($\omega$) and the slip frequency ($\omega r$):

$$\theta_r = \int \omega_s dt \; \omega_s = \omega + \omega_r \; \omega = Pp \cdot \Omega \qquad (1)$$

Pp stands for the pole-pair number of the motor, $\Omega$ is the mechanical speed.

$$\theta_r = Pp \int \Omega dt + \int \omega r \, dt \qquad (2)$$

Since the integral of the mechanical speed can be measured (by means of a position encoder), the problem is reduced to the integration of the (estimated) slip frequency $\omega r$. Most often $\omega r$ is determined based on the following equation:

$$\omega r = \frac{Rr}{\Psi_r} \cdot Iq \qquad (3)$$

Rr stands for the rotor resistance.

The difficulty with the above expression for slip is the fact that it depends on the rotor resistance, which changes with rotor temperature. In the typical use of an induction motor, the rotor temperature experiences a large temperature swing and the rotor resistance will vary accordingly. If the slip is not estimated correctly, the synchronous (dq) frame is no longer aligned with the rotor flux and the FOC becomes "detuned" hence degrading the motor performance.

BRIEF SUMMARY OF THE INVENTION

It is therefore an object of this invention to provide an improved indirect rotor resistance estimator system and method for an AC induction motor.

It is a further object of this invention to provide such an improved indirect rotor resistance estimator system and method which does not require any specialty sensors such as torque or voltage sensors.

It is a further object of this invention to provide such an improved indirect rotor resistance estimator system and method which is compatible with regular inverter switching patterns and standard inverter hardware.

It is a further object of this invention to provide such an improved indirect rotor resistance estimator system and method which is applicable when the motor is rotating and during speed changes.

It is a further object of this invention to provide such an improved indirect rotor resistance estimator system and method which ties directly into the framework of FOC, requiring only minimal additional software.

It is a further object of this invention to provide such an improved indirect rotor resistance estimator system and method which does not depend on a complex motor model or accurate knowledge of other motor parameters.

The invention results from the realization that a truly improved, simple, yet highly effective, indirect rotor resistance estimation system and method for an AC induction motor can be effected using the conventional synchronous frame current regulator by commanding first the quadrature current, then the direct or magnetizing current to be set substantially to zero causing the stator current to become zero while the induced current instead flows in the rotor; the stator voltage in attempting to keep stator current at zero decays correspondingly to the induced rotor current decay. At any selected time along the decaying stator voltage an increment of time or voltage can be measured to define an increment of voltage or time which can be applied to a stored table of corresponding rotor resistances which correspond to the increment of voltage or time.

The subject invention, however, in other embodiments, need not achieve all these objectives and the claims hereof should not be limited to structures or methods capable of achieving these objectives.

This invention features an indirect rotor resistance estimation system for an AC induction motor including a synchronous frame current regulator, responsive to direct and quadrature current commands and sensed fixed frame motor winding currents, for providing direct and quadrature voltages and converting them to fixed frame voltages, adjusted for the rotor flux angle, to drive the motor power stage; and a control circuit for successively stepping quadrature command to zero and the direct current command to a predetermined value causing the quadrature stator voltage to decay as a representation of rotor current decay. There is a storage device for storing at least one stator voltage decay time/voltage difference and corresponding reference rotor resistance; and a measurement circuit, responsive to the decaying stator voltage reaching spaced thresholds, defines a voltage/time difference for retrieving from the storage device the associated rotor resistance.

In a preferred embodiment there may be further included a normalization circuit for normalizing the quadrature stator voltage decay with respect to motor speed. There may be further included a logic circuit for calculating slip frequency ($\omega_r$) from the retrieved rotor resistance. The logic circuit may further calculate the electrical frequency ($\omega_s$) from slip frequency ($\omega_s$). The logic circuit may further calculate the estimated rotor position ($\theta_r$) from the electrical frequency ($\omega_s$). The storage device may store time differences and corresponding reference rotor resistances. The storage device may store voltage differences and corresponding reference rotor resistances. The spaced thresholds may be times. The spaced thresholds may be voltage levels. The defined difference may be a voltage. The defined difference may be a time. The predetermined value may be substantially zero. The storage device may include a lookup table having a plurality of time/voltage differences and corresponding reference rotor resistances. There may be a set of lookup tables, one for each of a number of motor speed ranges.

This invention also features an indirect rotor resistance estimation system for an AC induction motor employing a synchronous frame current regulator, responsive to direct and quadrature current commands and sensed fixed frame motor winding currents, for providing direct and quadrature voltages and converting them to fixed frame voltages, adjusted for the rotor flux angle, to drive the motor power stage. The system includes a processor configured to successively step the quadrature command to zero and the direct current command to a predetermined value causing the quadrature stator voltage to decay as a representation of rotor current decay, store at least one stator voltage decay time/voltage difference and corresponding reference rotor resistance and defining, in response to the decaying stator voltage reaching spaced thresholds, a voltage/time difference for retrieving from storage device the associated rotor resistance.

In a preferred embodiment the processor may be further configured to normalize the quadrature stator voltage decay with respect to motor speed. The processor may be further configured to calculate slip frequency ($\omega_r$) from retrieved rotor resistance; to calculate electrical frequency ($\omega_s$) from slip frequency ($\omega_r$) and to estimate rotor position ($\theta_r$) from an electrical frequency ($\omega_s$). Time differences may be stored with corresponding reference rotor resistances and the spaced thresholds may be voltages. Voltage differences may be stored with corresponding reference rotor resistances and the spaced thresholds may be times. The predetermined value may be substantially zero. The processor may be configured to store a lookup table having a plurality of time/voltage differences and corresponding reference rotor resistances. The processor may be configured to store a set of lookup tables, one for each of a number of motor speed ranges.

This invention also features an indirect rotor resistance estimation method for an AC induction motor employing a synchronous frame current regulator, responsive to direct and quadrature current commands and sensed fixed frame motor winding currents, for providing direct and quadrature voltages and converting them to fixed frame voltages, adjusted for the rotor flux angle, to drive the motor power stage including successively stepping the quadrature command to zero and the direct current command to a predetermined value causing the quadrature stator voltage to decay as a representation of rotor current decay; defining, in response to the decaying stator voltage reaching spaced thresholds, a voltage/time difference+, and retrieving from a storage device the rotor resistance associated with the voltage/time difference.

In a preferred embodiment the indirect rotor resistance estimation method may further include normalizing the quadrature stator voltage decay with respect to motor speed. The method may further include calculating slip frequency ($\omega_r$) from retrieved rotor resistance; calculating electrical frequency ($\omega_s$) from slip frequency ($\omega_r$); and estimating rotor position ($\theta_r$) from electrical frequency ($\omega_s$). Time differences may be stored with corresponding reference rotor resistances and the spaced thresholds may be voltages. The voltage differences may be stored with corresponding reference rotor resistances and the spaced thresholds may be times. The predetermined value may be substantially zero.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
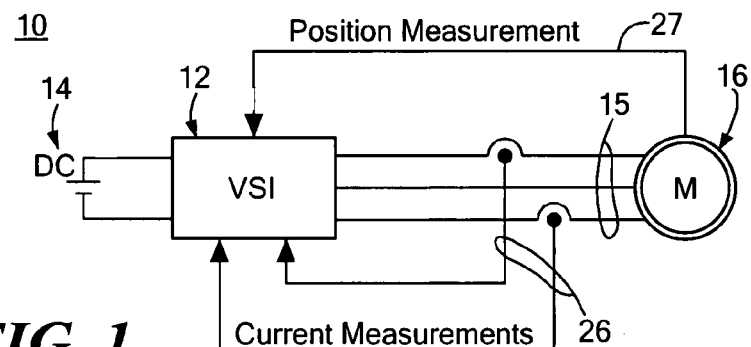
FIG. 1 is a schematic block diagram of an AC induction motor control.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 2:
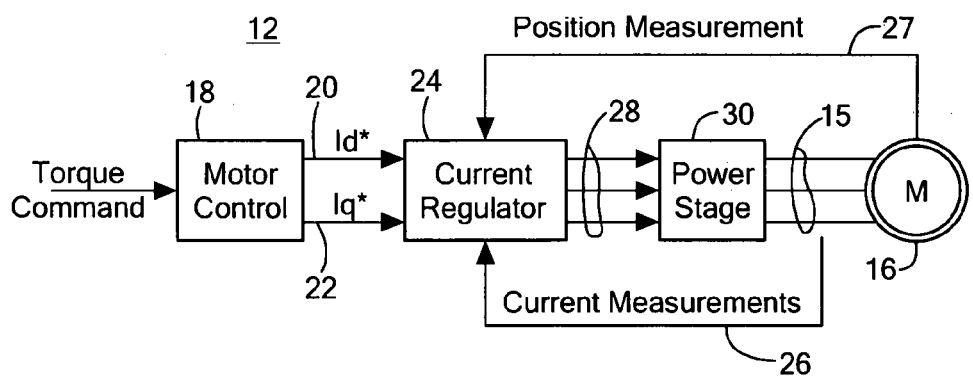
FIG. 2 is a schematic block diagram of the voltage source inverter of FIG. 1.
Figure 3:
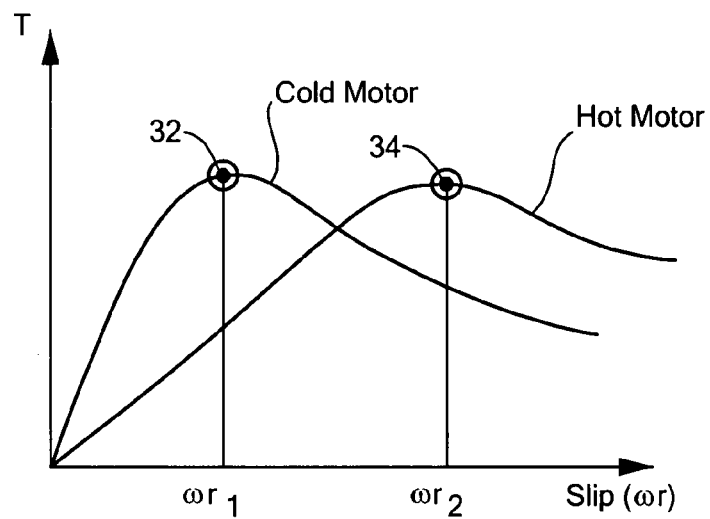
FIG. 3 illustrates the shift of the torque characteristic slip with rotor temperature.

There is shown in FIG. 1, an AC induction motor control 10 including a voltage source inverter (VSI) 12 which derives power from a dc source, such as battery 14, to drive AC induction motor 16. VSI 12 receives current measurement feedback on line 26 and position measurement feedback on line 27. VSI 12 may include a motor control block 18, FIG. 2, which receives a torque command and current regulator 24 which responds to the direct and quadrature current set-points $i_d$, $i_q$ on lines 20 and 22 and to a current measurement delivered on line 26 and position measurement delivered on line 27 to provide control signals on lines 28 to the power stage 30 which then drives the AC motor. VSI 12 provides three phase power to motor 16 over lines 15 and measures the current in two of the three lines via lines 26. The slip, $\omega r_1$, FIG. 3, to maintain maximum torque 32 when the motor is cold is different than the slip $\omega r_2$ required for maximum torque 34 when the motor is at elevated temperature. The invention applies a transient method by first applying stator current to the motor at zero slip (synchronous frequency) and then abruptly setting the stator current substantially to zero. Currents in a motor create a magnetic field which can not decay instantaneously, since it is a form of energy storage. As a consequence, when stator current is switched to zero, currents start flowing in the rotor. This causes the magnetic field in the motor to decay, since the energy is being transformed into heat due to the rotor resistance. The decay of the flux is exponential, with a time constant that is inversely proportional to the rotor resistance. The decay time is therefore a measure of rotor resistance, which can be used to better estimate the slip and improve the rotor flux angle calculation.

This invention results from the realization that the magnetic field in the motor induces a voltage at the motor terminals, which is proportional to the derivate of the flux vector. This voltage therefore decays at the same rate as the magnetic field. The decay of the flux can therefore be observed by measuring the voltage at the motor terminals. This invention therefore uses the stator voltage at the output of the existing synchronous frame current regulator 24, FIG. 2, to determine the flux decay time, which in turn allows for an estimation of the rotor resistance. Again, the estimation of rotor resistance is used to improve the rotor flux angle calculation.

The present invention magnetizes the motor and switches the magnetizing current into the rotor in order to observe the discharge time. However, unlike prior art, the present invention proposes working "on the fly" while the motor is spinning and even during rapid speed variations. It is therefore very well suited for hybrid vehicle applications, especially in the context of motors and generators in parallel hybrids. Further advantages of the proposed solution are that no voltage sensors are required and no additional switches are needed to disconnect the phase wires during the test. As the result, the proposed solution does not require any hardware changes and does not add cost to the motor controller. And it can be implemented entirely in software if desired.

Figure 4:
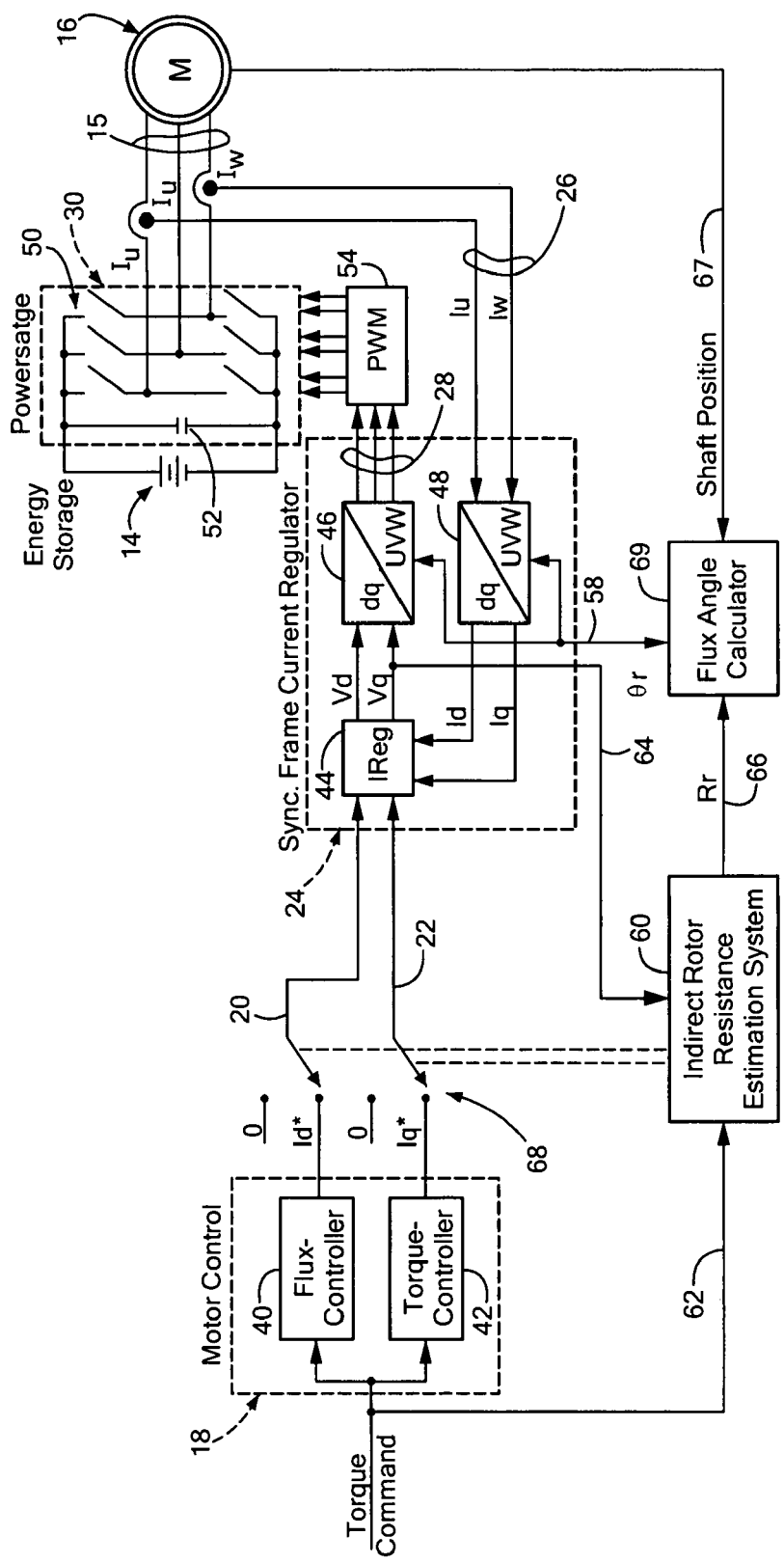
FIG. 4 is a schematic diagram of torque controller, synchronous frame current regulator and a power stage in more detail and an indirect rotor resistance estimation system according to this invention.

Motor control block 18, FIG. 4, includes flux controller 40 and torque controller 42 which responds to the torque command to produce current $I_d$ and $I_q$ on lines 20 and 22 to synchronous frame current regulator 24. Synchronous frame current regulator 24 includes a current regulator 44, a synchronous frame to fixed frame converter 46 and a fixed frame to synchronous frame converter 48. Power stage 30 includes a set of switches 50 and filter capacitor 52 and a pulse width modulated control 54.

In operation the current in two of the power lines 15 is measured, for example currents $I_u$, $I_w$ in the fixed frame domain. These are converted from the fixed frame domain to the synchronous domain by converter 48 to provide measured currents $I_d$, $I_q$ to current regulator 44. The transformation in converter 48 is adjusted using the input of the rotor flux angle $\theta_r$ on line 58. With this measured input $I_d$, $I_q$ and the commanded input $I_{d*}$, $I_{q*}$, current regulator 44 produces voltages $V_d$, $V_q$, which it delivers to converter 46. Converter 46 also uses the rotor flux angle $\theta_r$ in converting from the synchronous frame (dq) back to the fixed frame UVW form. These outputs are provided to pulse width modulator controller 54 which drives switches 50 in the conventional fashion to power motor 16 over lines 15. All of this is conventionally known.

In keeping with this invention an indirect rotor resistance estimation system 60 is employed which monitors a torque command on line 62 and the magnetizing voltage $V_q$ on line 64 to produce an estimation of the rotor resistance on line 66. Indirect rotor resistance estimation system 60 also includes switching device 68 which successively sets $I_{q*}$ and then $I_{d*}$ to zero to perform its estimation operation. Flux angle calculator block 67 uses the shaft position 69 and the rotor resistance estimate to calculate the flux angle, which is then used for the coordinate transformation. Although quadrature command $I_q$ is stepped to zero, direct command $I_d$ maybe stepped to a predetermined value (S) where S could be zero, substantially zero, or some other value such as ½, ¼, ... of the initial value.

Figure 5:
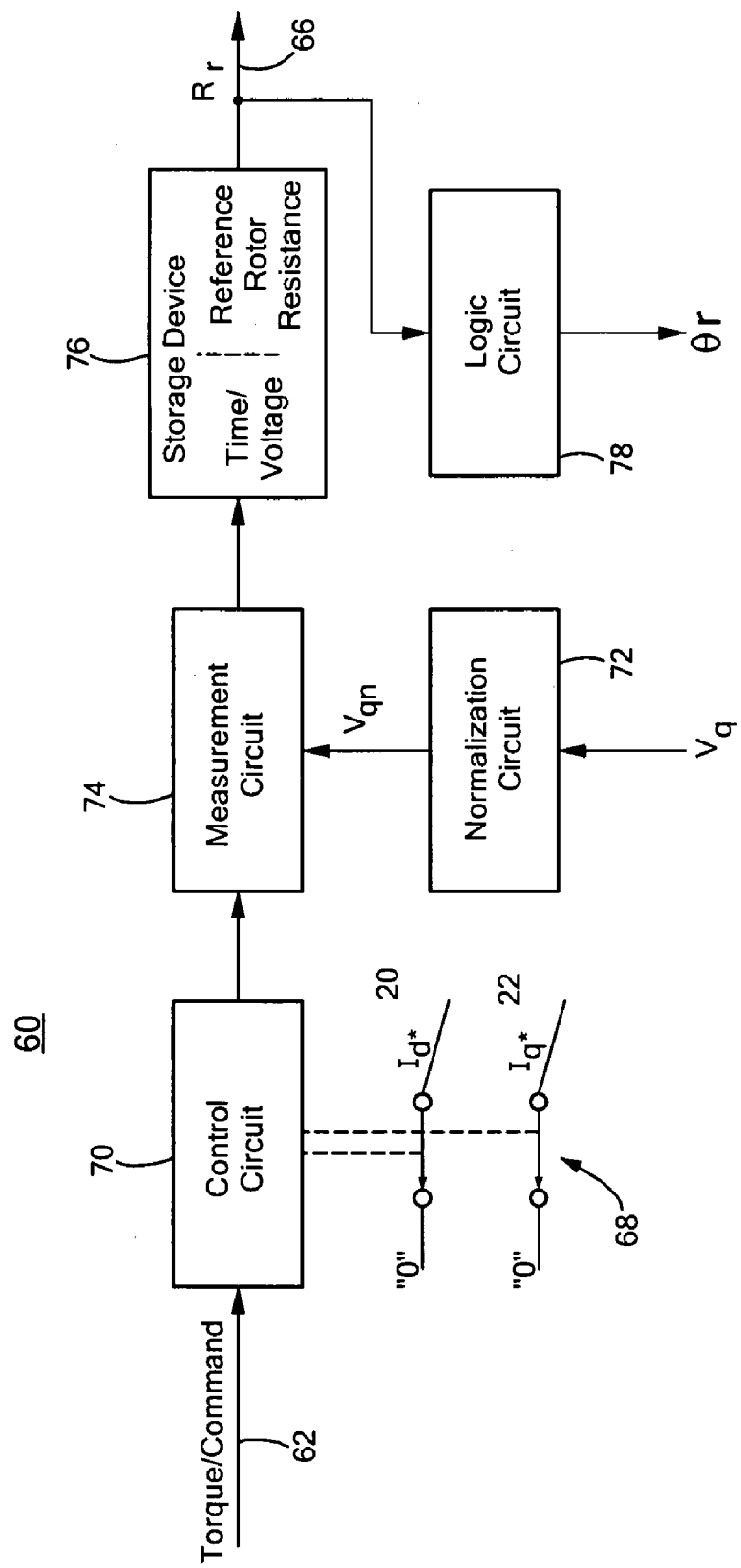
FIG. 5 is a more detailed schematic diagram of one embodiment of the indirect rotor resistance estimation system of FIG. 4.

In one embodiment indirect rotor resistance estimation system 60, FIG. 5, may include a control circuit 70 which in the absence of a torque command on line 62 actuates switches 68 to apply a zero, first to drive $I_{q*}$ to zero on line 22 and then after a suitable settling time period to set $I_{d*}$ to zero on line 20. The stator voltage represented by voltage $V_q$ will now decay at the same rate as the rotor current $I_d$. Normalization circuit 72 normalizes $V_q$ for speed and provides the normalized voltage $V_{qn}$ to measurement circuit 74. By normalizing the measurement based on the speed measurement the speed dependency of the flux-vector derivative can be eliminated:

$$V_{qn}(t) = V_q(t) \cdot \frac{\Omega ref}{\Omega(t)} \tag{4}$$

Measurement circuit 74 then measures the time elapsed between two spaced threshold voltages as $V_{qn}$ decays and this time is then used to retrieve from storage 76 a corresponding reference rotor resistance $R_r$ which is provided on line 66 as the estimated rotor resistance. Alternatively, measurement circuit 74 could measure the voltage change between two spaced times or time thresholds and use the delta voltage or voltage increment to retrieve the reference rotor resistance from storage 76. Logic circuit 78 may also be provided. Logic circuit 78 can first calculate:

$$\omega r = \frac{Rr}{\Psi r} \cdot Iq \qquad (5)$$

Where, $R_r$ is the rotor resistance, $I_q$ is the quadrature current, and $\Psi_r$ is the rotor flux, to obtain the slip frequency $\omega_r$. $\omega_r$ can then be used along with the rotational frequency of the rotor $\Omega$ to obtain the electrical frequency $\omega_s$. The electrical frequency $\omega_s$ is then integrated $$\theta_r = \int \omega_s dt \qquad (6)$$

to obtain rotor flux angle $\theta_r$. The circuits shown in FIG. 5, can also be implemented using a DSP. Storage 76 may simply contain:

dT=100 ms->Rr=1 Ohm. Based on the actual measurement, the rotor resistance would be estimated by means of simple scaling: dT=200 ms->Rr=1 Ohm*100 ms/200 ms. Or a lookup table could be used which contains a number of entries, for example:

| dT | Rr |
|---|---|
| 50 ms | 0.5 Ohm |
| 100 ms | 1 Ohm |
| 150 ms | 1.33 Ohm |
| 200 ms | 2 Ohm |

This table could even be three-dimensional depending on speed.

1000 rpm:

| dT | Rr |
|---|---|
| 50 ms | 0.5 Ohm |
| 100 ms | 1 Ohm |
| 150 ms | 1.33 Ohm |
| 200 ms | 2 Ohm |

2000 rpm:

| dT | Rr |
|---|---|
| 50 ms | 0.6 Ohm |
| 100 ms | 1.2 Ohm |
| 150 ms | 1.5 Ohm |
| 200 ms | 2.3 Ohm |

Figure 6:
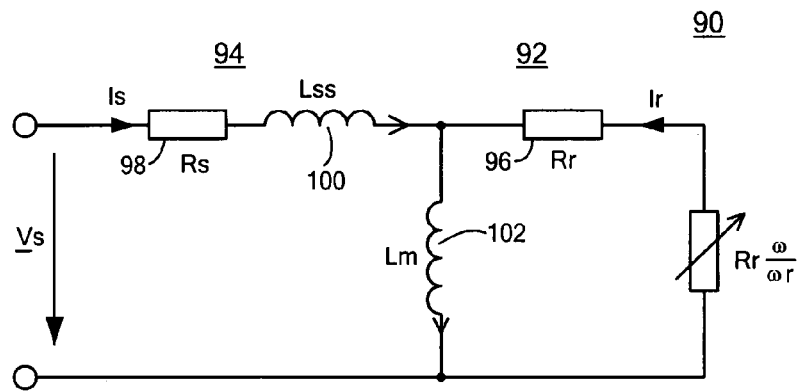
FIG. 6 is an equivalent circuit of an AC induction motor.
Figure 7:
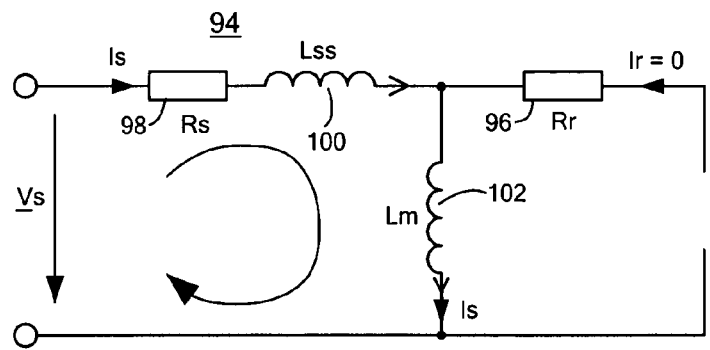
FIG. 7 shows the equivalent circuit of FIG. 6 when the rotor current is set to zero.
Figure 8:
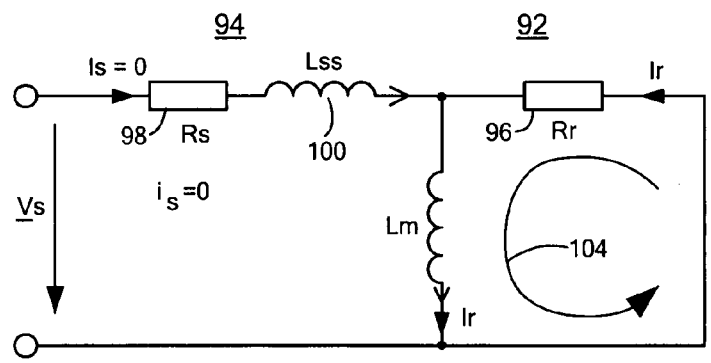
FIG. 8 shows the equivalent circuit of FIG. 6 when the stator current to is set to zero.

A fuller understanding of the invention may be obtained using an AC induction motor equivalent circuit 90, FIG. 6, which includes a rotor portion 92 and a stator portion 94. Rotor portion 92 being represented with rotor resistance 96 and stator portion 94 including rotor resistance 98 and leakage inductance 100 and a magnetizing inductance 102. In the first step of operation of switch 68 the rotor current $I_r$ is set to zero (by setting the slip to zero), FIG. 7, while the stator current $I_s$ still flows and stator voltage $V_s$ appears across the terminals. In FIG. 8, the stator current is forced to zero by the action of current regulator 44, thus the collapsing field will induce a current $I_r$ 104 only in the rotor. As this current $I_r$ 104 decays, current regulator 44 keeps the stator current at zero causing the output of the current regulator $V_q^*$ to decrease or decay at the same rate as current 104. It is this easily available decaying voltage $V_q^*$ that the invention uses to determine the rotor resistance without stopping motor operation and without any added hardware.

Figure 9:
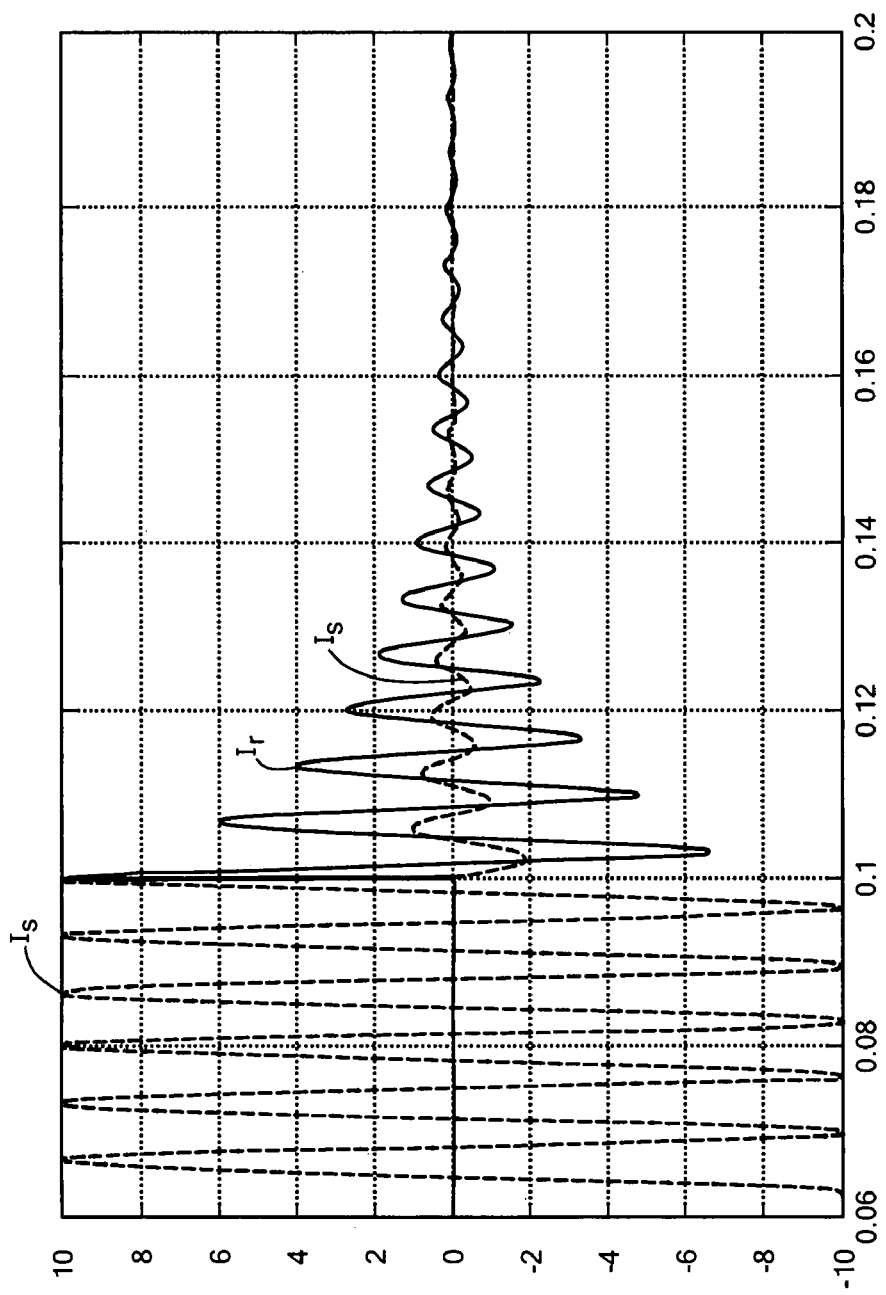
FIG. 9 is a combined illustration of the stator and rotor current conditions when the stator current $i_{dq}$ is set to zero.
Figure 10:
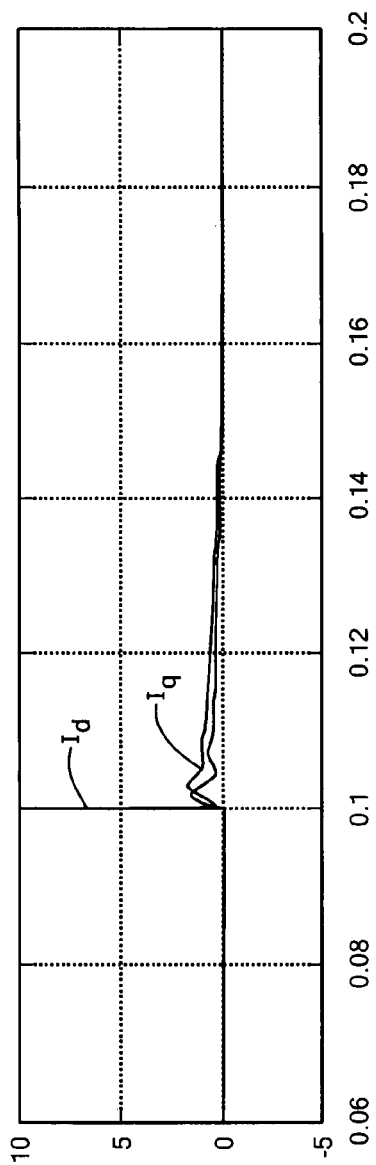
FIG. 10 illustrates the setting of $i_d$ to zero with $i_q$ already at zero.
Figure 11:
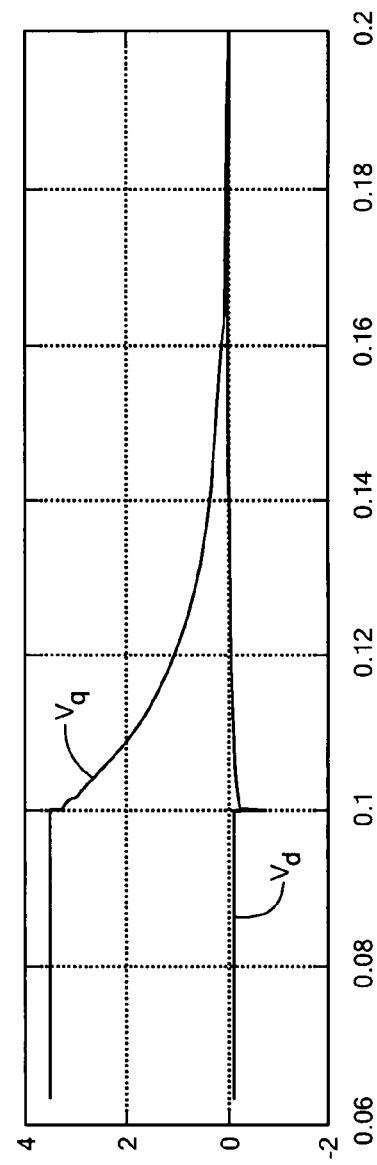
FIG. 11 illustrates the response of $V_d$ and $V_q$ to the currents in FIG. 10 and the decay of $V_q$ at the same rate as the rotor current.
Figure 12:
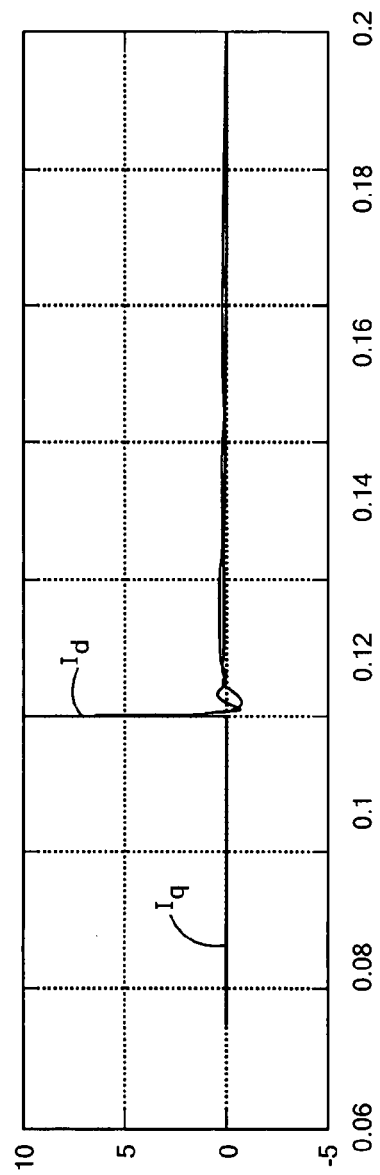
FIGS. 12 and 13 are view similar to FIGS. 10 and 11 during a rapid speed change illustrating the change in shape due to the speed change.
Figure 13:
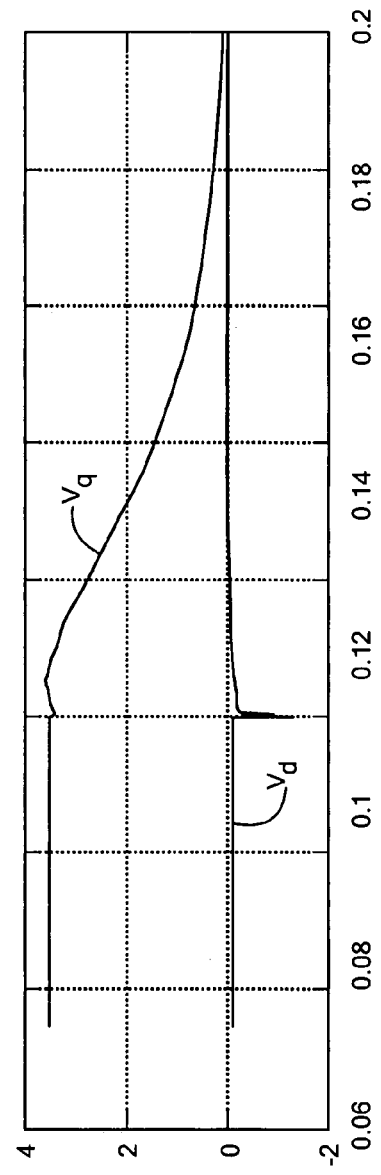

FIG. 9 depicts the case of stepping the stator current (iq=0, id>0) to zero (iq=id=0) at t=0.1. The dashed trace shows the stator current (Is) and the solid trace represents the rotor current (Ir). The rotor current is zero before the stator current step (because iq=0). However, when id is set to zero, the magnetizing current is switched over to the rotor (Ir≠0). As the magnetizing inductance is being discharged, the rotor current decays. FIGS. 10 and 11 show the same simulation in the synchronous (dq) frame. Vq/Vq is the output of the current regulator. It can be seen how Vq decays at the same rate as the rotor current. The preferred embodiment of the invention therefore uses this quantity to determine the rotor flux decay time/voltage, and, from it, the actual value of the rotor resistance. At zero phase current ($I_d=I_q=0$) the terminal voltage is equal to the derivative of the rotor flux. This derivative is proportional to rotor speed. The faster the motor spins, the larger is the induced voltage and the more accurate is the measurement. FIGS. 12 and 13 illustrate the same current step as simulated in FIGS. 10 and 11 but here during a rapid speed change. Thus, curve $V_q$ takes a different shape due to its dependency on speed. The speed dependency can be eliminated by normalizing the measurement based on speed measurement as explained previously.

The advantage of using the current regulator for forcing the phase currents to zero is twofold: no external switches are required to fully disconnect the motor phases and an indirect phase voltage measurement can be obtained form the outputs of the current regulators, without the need for physical voltage sensors.

While the normalized Vq curve resembles a natural exponential decay, it is in reality quite nonlinear due to the saturation of the magnetizing inductance. If an accurate model of the magnetizing inductance is known, a least-squares regression or other curve fit can be used to directly identify the rotor resistance. The preferred embodiment, however, is based on a much simpler approach: instead of looking for an absolute determination of rotor resistance, the relative change from a controlled laboratory test is measured. Several relatively simple measurements can be used to determine the relative change of rotor resistance from a known reference condition. Most of them fall into one of the two following categories (illustrated below):

Measurement of time difference (Δt) between two voltage thresholds

Measurement of voltage difference (ΔV) between two time thresholds

Figure 14:
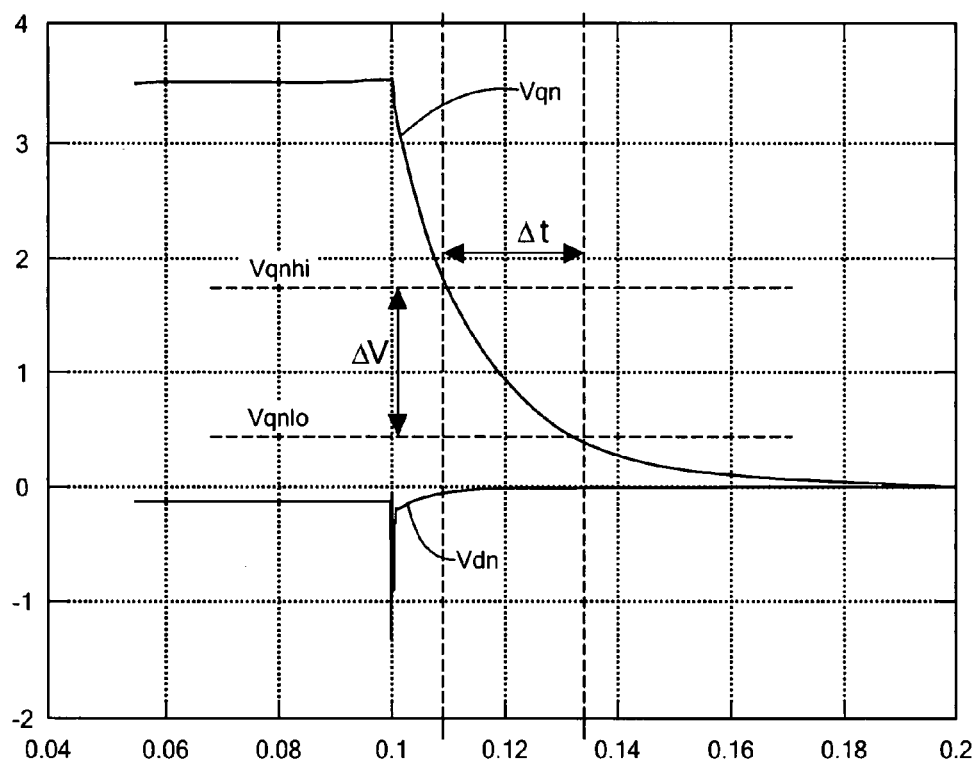
FIG. 14 illustrates taking a measurement of time or voltage between two thresholds of voltage or time to retrieve a corresponding stored rotor resistance value.

The preferred embodiment of this invention, FIG. 14, uses a time measurement between two voltage thresholds (Vqnhi, Vqnlo) on the speed-normalized terminal voltage. The measured time (Δt) is compared to a reference measurement (Δt_ref, Rr_ref) taken on an instrumented dynamometer setup. The ratio of the two time-measurements can be used to determine the rotor resistance:

$$Rr = Rr\_ref \cdot \frac{\Delta t\_ref}{\Delta t} \qquad (7)$$

If the rotor-temperature at which the reference data was taken is known, it is possible to determine the rotor temperature from the estimated rotor resistance (using the temperature coefficient of resistance). This information can be used for protecting the rotor from overheating, by derating the rotor current above a certain rotor temperature if the measurements are beyond typical limits determined during commissioning, a motor failure can be detected and the drive shut down for safety reasons.

Figure 15:
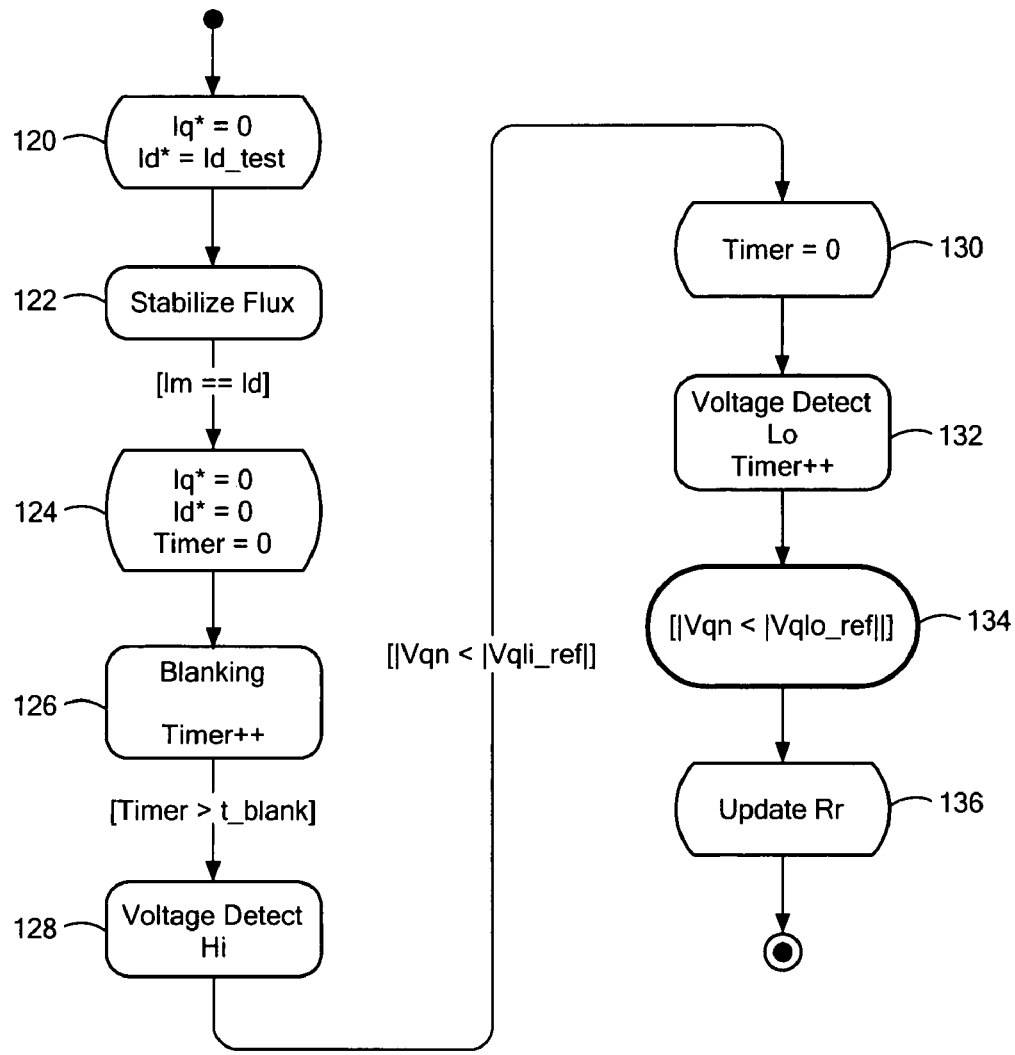
FIG. 15 is a flow chart of the indirect rotor resistance estimation method of this invention.

One method of implementing this invention is shown in FIG. 15, where first, Iq is set to zero and Id is set to the minimal value required for the test, 120. Then, it is necessary to wait until the flux has stabilized (i.e. im=id) 122. The duration of the "Stabilize Flux" state can be fixed or adaptive. Once the flux is stabilized, Id is stepped to zero 124. This induces a small voltage transient (caused by the leakage inductance and the response of the current regulator) which must be ignored. Therefore, a blanking state (of fixed duration) is inserted before sensing the voltage (Vq) 126. Afterwards, the "Voltage Detect Hi" state 128 is entered which waits until the speed-normalized value of Vq drops below the first sense threshold (Vqhi_ref), at which point the timer is reset 130 and the "Voltage Detect Lo" state is entered 132. In the "Voltage Detect Lo" state, the timer is incremented until the speed-normalized value of Vq drops below the second threshold (Vqlo_ref) 134. At this point the timer is stopped and its value used to calculate the rotor resistance 136, as explained above.

Figure 16:
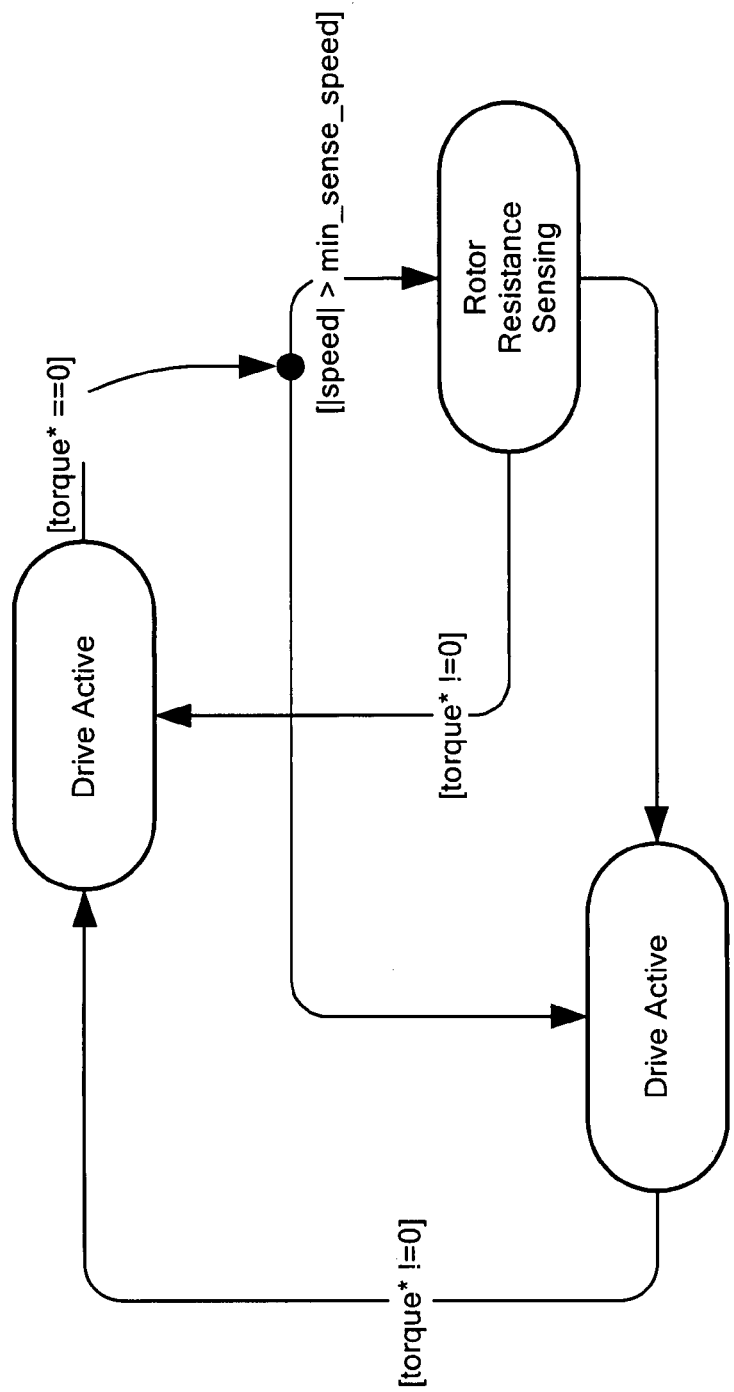
FIG. 16 is a flow charge for showing the indirect rotor resistance estimation of this invention in a motor control system.

FIG. 16 illustrates how the rotor resistance sensing can be tied into a motor control algorithm such as for hybrid vehicles. Whenever the torque request differs from zero, the "Drive Active" state is entered 140 and the currents Id/Iq are commanded in accordance to the desired torque. If the torque request goes to zero, and the speed is too low for rotor resistance sensing, the "Drive Passive" state is entered 142. If the speed is large enough, the control proceeds to the "Rotor Resistance Sensing" state 144, where it applies the Id current step and senses phase voltage. Should the motor torque be requested while in the "Rotor Resistance Sense" state, the sense algorithm is aborted and the control proceeds immediately to the "Drive Active" state.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An indirect rotor resistance estimation system for an AC induction motor comprising:
a synchronous frame current regulator, responsive to direct and quadrature current commands and sensed fixed frame motor winding currents, for providing direct and quadrature voltages and converting them to fixed frame voltages, adjusted for the rotor flux angle, to drive the motor power stage;
a control circuit for successively stepping said quadrature command to zero and said direct current command to a predetermined value causing the quadrature stator voltage to decay as a representation of rotor current decay;
a storage device for storing at least one stator voltage decay time/voltage difference and corresponding reference rotor resistance; and
a measurement circuit, responsive to the decaying stator voltage reaching spaced thresholds, for defining a voltage/time difference for retrieving from said storage device the associated rotor resistance.

2. The indirect rotor resistance estimation system of claim 1 further including a normalization circuit for normalizing the quadrature stator voltage decay with respect to motor speed.

3. The indirect rotor resistance estimation system of claim 1 further including a logic circuit for calculating slip frequency ($\omega_r$) from said retrieved rotor resistance.

4. The indirect rotor resistance estimation system of claim 3 in which said logic circuit further calculates the electrical frequency ($\omega_s$) from said slip frequency ($\omega_r$).

5. The indirect rotor resistance estimation system of claim 4 in which said logic circuit further calculates the estimated rotor position ($\theta_r$) from said electrical frequency ($\omega_s$).

6. The indirect rotor resistance estimation system of claim 1 in which said logic circuit further calculates the estimated rotor temperature from the estimated rotor resistance and uses it to protect the motor from overheating.

7. The indirect rotor resistance estimation system of claim 1 in which said storage device stores time differences and corresponding reference rotor resistances.

8. The indirect rotor resistance estimation system of claim 1 in which said storage device stores voltage differences and corresponding reference rotor resistances.

9. The indirect rotor resistance estimation system of claim 7 in which said spaced thresholds are times.

10. The indirect rotor resistance estimation system of claim 7 in which said spaced thresholds are voltage levels.

11. The indirect rotor resistance estimation system of claim 9 in which the defined difference is a voltage.

12. The indirect rotor resistance estimation system of claim 10 in which the defined difference is a time.

13. The indirect rotor resistance estimation system of claim 1 in which said predetermined value is substantially zero.

14. The indirect rotor resistance estimation system of claim 1 in which said storage device includes a lookup table having a plurality of time/voltage differences and corresponding reference rotor resistances.

15. The indirect rotor resistance estimation system of claim 1 in which said storage device includes a set of lookup tables, one for each of a number of motor speed ranges.

16. An indirect rotor resistance estimation system for an AC induction motor employing a synchronous frame current regulator, responsive to direct and quadrature current commands and sensed fixed frame motor winding currents, for providing direct and quadrature voltages and converting them to fixed frame voltages, adjusted for the rotor flux angle, to drive the motor power stage, said system including a processor configured to:
successively stepping the quadrature command to zero and said direct current command to a predetermined value causing the quadrature stator voltage to decay as a representation of rotor current decay;

store at least one stator voltage decay time/voltage difference and corresponding reference rotor resistance; and defining, in response to the decaying stator voltage reaching spaced thresholds, a voltage/time difference for retrieving from said storage device the associated rotor resistance.

17. The indirect rotor resistance estimation system of claim 16 in which said processor is further configured to normalize the quadrature stator voltage decay with respect to motor speed.

18. The indirect rotor resistance estimation system of claim 16 in which said processor is further configured to calculate slip frequency ($\omega_r$) from retrieved rotor resistance; to calculate electrical frequency ($\omega_s$) from slip frequency ($\omega_r$) and to estimate rotor position ($\theta_r$) from an electrical frequency ($\omega_s$).

19. The indirect rotor resistance estimation system of claim 16 in which time differences are stored with corresponding reference rotor resistances and the spaced thresholds are voltages.

20. The indirect rotor resistance estimation system of claim 16 in which voltage differences are stored with corresponding reference rotor resistances and the spaced thresholds are times.

21. The indirect rotor resistance estimation system of claim 16 in which said predetermined value is substantially zero.

22. The indirect rotor resistance estimation system of claim 16 in which said processor is configured to store a lookup table having a plurality of time/voltage differences and corresponding reference rotor resistances.

23. The indirect rotor resistance estimation system of claim 16 in which said processor is configured to store a set of lookup tables one for each of a number of motor speed ranges.

24. An indirect rotor resistance estimation method for an AC induction motor employing a synchronous frame current regulator, responsive to direct and quadrature current commands and sensed fixed frame motor winding currents, for providing direct and quadrature voltages and converting them to fixed frame voltages, adjusted for the rotor flux angle, to drive the motor power stage comprising;

successively stepping said quadrature command to zero and said direct current commands to a predetermined value causing the quadrature stator voltage to decay as a representation of rotor current decay;

defining, in response to the decaying stator voltage reaching spaced thresholds, a voltage/time difference, and retrieving from a storage device the rotor resistance associated with the voltage/time difference.

25. The indirect rotor resistance estimation method of claim 24 further including normalizing the quadrature stator voltage decay with respect to motor speed.

26. The indirect rotor resistance estimation method of claim 24 further including calculating slip frequency ($\omega_r$) from retrieved rotor resistance; calculating electrical frequency ($\omega_s$) from slip frequency ($\omega_r$); and estimating rotor position ($\theta_r$) from electrical frequency ($\omega_s$).

27. The indirect rotor resistance estimation method of claim 24 in which time differences are stored with corresponding reference rotor resistances and the spaced thresholds are voltages.

28. The indirect rotor resistance estimation method of claim 24 in which voltage differences are stored with corresponding reference rotor resistances and the spaced thresholds are times.

29. The indirect rotor resistance estimation method of claim 24 in which said predetermined value is substantially zero.

* * * * *